(12) United States Patent
Herrera et al.

(10) Patent No.: US 12,494,155 B2
(45) Date of Patent: Dec. 9, 2025

(54) DRIVING FOR MULTI-JUNCTION POLYCHROMIC DISPLAY DEVICES

(71) Applicant: Lumileds Singapore Pte. Ltd., Singapore (SG)

(72) Inventors: Daniel Herrera, Santa Clara, CA (US); Ronald Johannes Bonne, Plainfield, IL (US); Lisheng Shi, San Jose, CA (US)

(73) Assignee: Lumileds Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/383,698

(22) Filed: Oct. 25, 2023

(65) Prior Publication Data

US 2025/0140160 A1 May 1, 2025

(51) Int. Cl.
*G09G 3/20* (2006.01)
*G09G 3/32* (2016.01)
*H01L 25/16* (2023.01)

(52) U.S. Cl.
CPC ............ *G09G 3/2096* (2013.01); *G09G 3/32* (2013.01); *H01L 25/167* (2013.01);
(Continued)

(58) Field of Classification Search
CPC .................. G09G 3/2096; G09G 3/32; G09G 2300/0452; G09G 2310/0297;
(Continued)

(56) References Cited

U.S. PATENT DOCUMENTS 6,822,991 B2 11/2004 Collins, III et al.
6,847,057 B1  1/2005 Gardner et al.
(Continued)

FOREIGN PATENT DOCUMENTS

CN   112969264 A   6/2021
CN   115399071 A   11/2022

OTHER PUBLICATIONS

"International Application Serial No. PCT/US2024/049416, International Search Report mailed Nov. 27, 2024", 4 pgs.
(Continued)

*Primary Examiner* — Doon Y Chow
(74) *Attorney, Agent, or Firm* — Schwegman, Lundberg & Woessner, P.A.

(57) ABSTRACT

A lighting system and method of driving an array within the lighting system are disclosed. The array includes vertically-stacked multi-color micro light-emitting diode (microLED) devices that emit light of different colors. Driving circuits and a ground switching circuit are controlled by processing circuitry to sequentially emit the colors of each microLED by independently driving pn junctions of the microLED. Each driving circuit includes multiplexers to receive a sink/source current and selectably provide the sink/source current to a channel based on control signals from the processing circuitry. Dimming of a particular color is effected using a pulse width modulated (PWM) signal to adjust a duty cycle over which the sink/source current is applied to the channel. The ground switching circuit selects another channel using multiplexers, and grounds the channel such that current is limited to flowing through one of the pn junctions at a time.

20 Claims, 10 Drawing Sheets

(52) U.S. Cl.
CPC ............... *G09G 2300/0452* (2013.01); *G09G 2310/0297* (2013.01); *G09G 2320/0626* (2013.01); *G09G 2320/0666* (2013.01)

(58) Field of Classification Search
CPC .... G09G 2320/0626; G09G 2320/0666; H01L 25/167
See application file for complete search history.

(56) References Cited

U.S. PATENT DOCUMENTS

| | | | |
|---|---|---|---|
| 9,246,403 B2* | 1/2016 | Siessegger | H01L 33/62 |
| 10,178,717 B2* | 1/2019 | Seyler | H05B 45/48 |
| 10,236,409 B2 | 3/2019 | Wildeson et al. | |
| 10,541,352 B2 | 1/2020 | Ishikawa et al. | |
| 10,622,206 B2 | 4/2020 | Wildeson et al. | |
| 10,749,070 B2 | 8/2020 | Wildeson et al. | |
| 10,804,429 B2 | 10/2020 | Wildeson et al. | |
| 10,948,779 B2 | 3/2021 | Jamali et al. | |
| 11,069,524 B2 | 7/2021 | Wildeson et al. | |
| 11,069,525 B2 | 7/2021 | Wildeson et al. | |
| 11,069,836 B2 | 7/2021 | Ishikawa et al. | |
| 11,081,622 B2 | 8/2021 | Wildeson et al. | |
| 11,404,599 B2 | 8/2022 | Wildeson et al. | |
| 11,561,437 B2 | 1/2023 | Jamali et al. | |
| 11,594,572 B2 | 2/2023 | Wildeson et al. | |
| 2002/0043561 A1 | 4/2002 | Tsikos et al. | |
| 2003/0019933 A1 | 1/2003 | Tsikos et al. | |
| 2003/0042303 A1 | 3/2003 | Tsikos et al. | |
| 2003/0052169 A1 | 3/2003 | Tsikos et al. | |
| 2004/0080938 A1 | 4/2004 | Holman et al. | |
| 2004/0105264 A1 | 6/2004 | Spero | |
| 2005/0074834 A1 | 4/2005 | Chaplen et al. | |
| 2005/0116667 A1 | 6/2005 | Mueller et al. | |
| 2006/0002110 A1 | 1/2006 | Dowling et al. | |
| 2006/0132398 A1* | 6/2006 | Kim | G09G 3/20 345/76 |
| 2007/0257623 A1* | 11/2007 | Johnson | H05B 45/24 315/193 |
| 2008/0231567 A1 | 9/2008 | Van et al. | |
| 2009/0230883 A1* | 9/2009 | Haug | H05B 45/48 315/297 |
| 2011/0062874 A1 | 3/2011 | Knapp | |
| 2011/0069094 A1 | 3/2011 | Knapp | |
| 2011/0069960 A1 | 3/2011 | Knapp et al. | |
| 2011/0312841 A1 | 12/2011 | Silverbrook et al. | |
| 2012/0206050 A1 | 8/2012 | Spero | |
| 2012/0320103 A1 | 12/2012 | Jesme et al. | |
| 2015/0015147 A1 | 1/2015 | Knapp | |
| 2019/0229149 A1* | 7/2019 | Yoo | H10H 29/142 |
| 2020/0152613 A1* | 5/2020 | Deckers | H05K 1/056 |
| 2020/0193905 A1* | 6/2020 | Yoon | G09G 3/3233 |
| 2020/0326574 A1 | 10/2020 | Jamali et al. | |
| 2021/0110758 A1* | 4/2021 | Rossini | H01L 25/18 |
| 2021/0181557 A1 | 6/2021 | Jamali et al. | |
| 2021/0251066 A1* | 8/2021 | Bonne | H05B 45/30 |
| 2022/0375397 A1 | 11/2022 | Van Lier et al. | |
| 2023/0020077 A1* | 1/2023 | Deckers | B60Q 1/0408 |
| 2024/0429343 A1* | 12/2024 | Wang | H10H 20/01 |
| 2025/0144291 A1 | 5/2025 | Dave et al. | |

OTHER PUBLICATIONS

"International Application Serial No. PCT/US2024/049416, Written Opinion mailed Nov. 27, 2024", 14 pgs.

"International Application Serial No. PCT US2024 053786, International Search Report mailed Feb. 5, 2025", 3 pages.

"International Application Serial No. PCT US2024 053786, Written Opinion mailed Feb. 5, 2025", 13 pages.

"U.S. Appl. No. 18/387,205, Non Final Office Action mailed Jul. 30, 2025", 16 pgs.

* cited by examiner

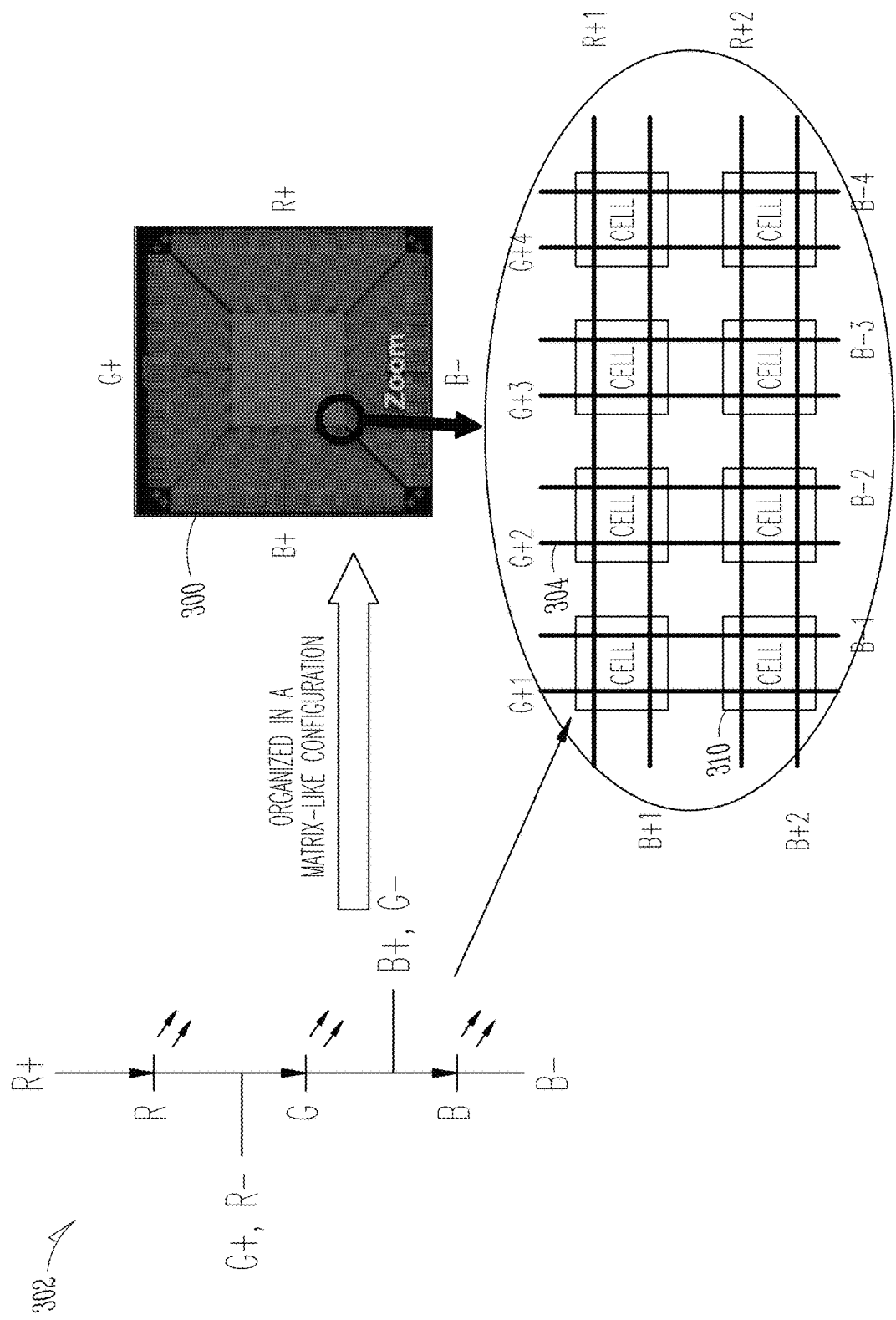

DRIVING FOR MULTI-JUNCTION POLYCHROMIC DISPLAY DEVICES

BACKGROUND OF THE DISCLOSURE

Light-emitting diodes (LEDs) provide an efficient and relatively smaller source of light compared to conventional light sources. The use of LEDs has evolved from systems that provide purely lighting to more complicated systems that use light in displays and functions other than merely to provide illumination of an area. Consequently, there is ongoing effort to improve technology that uses LED arrays, as well as find additional uses for LED arrays.

BRIEF DESCRIPTION OF THE DRAWINGS

FIG. 3 shows an example of a polychromic matrix in accordance with various embodiments of the disclosed subject-matter.

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

Figure 1:
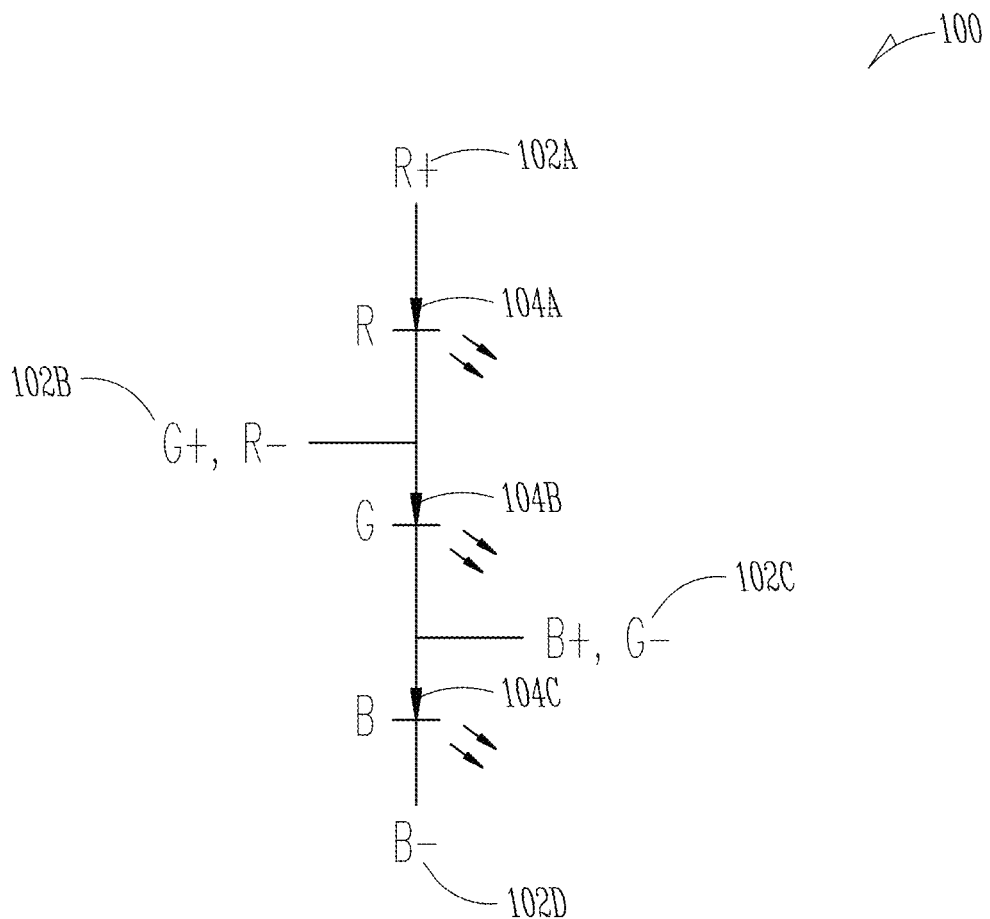
FIG. 1 shows an example of a three-junction polychromic device.

The use of the LEDs in electronic devices has increased rapidly as the number and types of devices have expanded in various ways. Beyond mere displays, for example, compact light sources have recently been incorporated in augmented reality (AR) and virtual reality (VR) devices, among others. Such devices may be enabled by microLED arrays.

A microLED array may contain thousands to millions or more of microscopic microLEDs that may be individually controlled or controlled in groups of pixels (e.g., 5×5 groups of pixels). MicroLEDs are relatively small (e.g., <0.07 mm on a side) and may provide monochromatic or multi-chromatic light, typically red, green, blue, or yellow using inorganic semiconductor materials. Other LEDs may have a size, for example, of about 4 mm², 250 micron×250 micron, or larger.

Active layers of microLEDs in general may be formed from one or more inorganic materials (e.g., binary compounds such as gallium arsenide (GaAs), ternary compounds such as aluminum gallium arsenide (AlGaAs), quaternary compounds such as indium gallium phosphide (InGaAsP), gallium nitride (GaN), or other suitable materials), usually either III-V materials (defined by columns of the Periodic Table) or II-VI materials.

The microLEDs in the different arrays may emit light in the visible spectrum (about 400 nm to about 800 nm) and/or may emit light in the infrared spectrum (above about 800 nm). MicroLEDs may be formed by epitaxially growing active, n- and p-type semiconductors on a rigid or flexible substrate (which may be textured). The substrate may include, for example, sapphire aluminum oxide ($Al_2O_3$) or silicon carbide (SiC), among others. In particular, various layers are deposited and processed on the substrate during fabrication of the microLEDs to form a microLED array. The surface of the substrate may be pretreated to anneal, etch, polish, etc. the surface prior to deposition of the various layers. The original substrate may be removed and replaced by a thin transparent rigid substrate, such as glass, or a flexible substrate, for example plastic. In general, the various active layers may be fabricated using epitaxial semiconductor deposition to deposit one or more semiconductor layers, metal deposition (e.g., by sputtering), oxide growth, as well as etching, liftoff, and cleaning, among other operations.

In some aspects, the growth substrate may be removed from the microLED structure after fabrication and after connection (e.g., an electrical coupling) to contacts on a backplane via, for example, metal bonding such as wire or ball bonding. The backplane may be a printed circuit board or wafer or other substrate containing integrated circuits (ICs), such as a complementary metal oxide semiconductor (CMOS) IC wafer. The semiconductor deposition operations may be used to create a microLED with an active region in which electron-hole recombination occurs and the light from the microLED is generated. The active region may be, for example, one or more quantum wells. Metal contacts may be used to provide current to the n- and p-type semiconductors from the ICs of the backplane on which the microLED array is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some aspects, one or more other layers, such as a phosphor-converting layer that contains phosphor particles, may be disposed on some or all of the microLEDs or microLED arrays to convert at least a portion of the light from the microLEDs to light of a different wavelength. For example, blue light may be converted into near infrared light or white light by the phosphor-converting layer.

Recently, multi-junction polychromic microLED devices have been developed using, for example, InGaN as the active semiconductor. A polychromic InGaN device is a vertically-stacked multi-color (typically RGB) device in which three pn-junctions (for three colors) are connected or otherwise electrically coupled via tunnel junctions. The term vertical as used herein indicates a direction of growth or deposition on a substrate (an array of such devices thus has devices arranged in horizontal [or lateral] directions). Specifics of fabrication of the polychromic microLED devices may be found at U.S. Pat. Nos. 10,236,409B2, 10,749,070B2, 10,541,352B2, 10,804,429B2, 10,622,206B2, 11,069,836B2, 11,069,524B2, 11,069,525B2, 11,404,599B2, 11,081,622B2, 11,594,572B2, 6,822,991B2, 6,847,057B1, which are herein incorporated in their entirety.

Although a three-junction device is described herein, as it may be the most fundamental as a color-display engine, the number of junctions is not limited in this regard. Other devices may be fabricated using a two-junction or a four— (or more) junction device as the junctions are vertically stacked. This vertical stacking enables separate access to each junction by fabricating appropriate contacts via lithography and etching and deposition techniques.

FIG. 1 shows an example of a three-junction polychromic device. The three-junction polychromic device 100 has four electrical contact terminals 102a, 102b, 102c, 102d, which enable independent control of three current values. Each current value may be used to control a different junction 104a, 104b, 104c of the three-junction polychromic device 100. In some aspects, each junction 104a, 104b, 104c of the polychromic device 100 may be a different color, for example, red-green-blue (RGB) as shown in FIG. 1. In other aspects, at least one of the colors of the polychromic device 100 (whether three or more junctions are fabricated) may be the same, which may permit more precise control of the relative intensity of the colors.

In some aspects, the junctions 104a, 104b, 104c of the polychromic device 100 may be driven simultaneously to achieve a mixed color. For example, to synthesize white out of a vertically-stacked RGB emitter, current may flow through all three junctions 104a, 104b, 104c simultaneously. The resulting color may be tuned by adjusting ratios of currents going through each of the junctions 104a, 104b, 104c. To adjust the ratios, current may flow into and out of the different intermediate contact terminals 102a, 102b, 102c, 102d. However, independent control of the different currents at any given moment is a source of complications to circuit designing.

To reduce the driving complexity, in some aspects, the multiple junctions 104a, 104b, 104c may be driven sequentially rather than simultaneously (i.e., avoiding simultaneous driving). Because of persistence of human vision, color mixing may be achieved by switching primary colors at a rate that is relatively fast (e.g., faster than a video frame rate of 24 or 30 frames per second) in the time domain, which is referred to as sequential driving. One benefit to the driving circuitry, while achieving satisfactory color mixing to the human eye, is that by shifting a small amount of current between the (primary-color) pn junctions (microLEDs), the load to the circuitry may be reduced by controlling and/or monitoring only one current. In addition, sequential driving may provide an extra dimension of color control as color tuning can be performed by adjusting each current for a single cycle (the same as simultaneous driving). In other aspects, color control also may be implemented by adjusting each on-time duration per cycle (e.g., the on-duration of a pulse width modulated (PWM) signal), a technique that may be more complicated than the sequential approach described herein.

The sequential driving may be defined, in some aspects, as up to only one junction of the vertically stacked polychromic junctions being driven at any instance in time. The polychromic junctions may be driven by a forward current, at any instance. At some time instances, zero junctions may be driven—i.e., the polychromic device is turned off. As above, the three-junction RGB polychromic device is merely an example of vertically-stacked junction LED devices, whose number of individual microLEDs and thus colors may be different from that described herein.

Figure 2C:
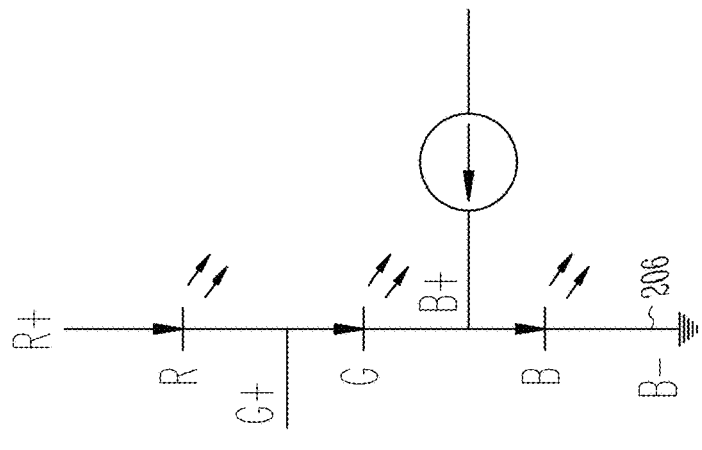
FIGS. 2A-2C show examples of sequential driving of the three-junction RGB polychromic device shown in FIG. 1.
Figure 2B:
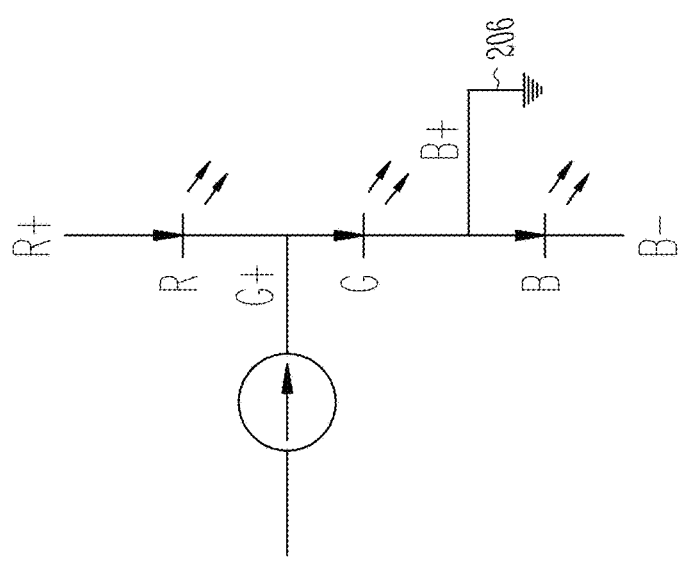
Figure 2A:
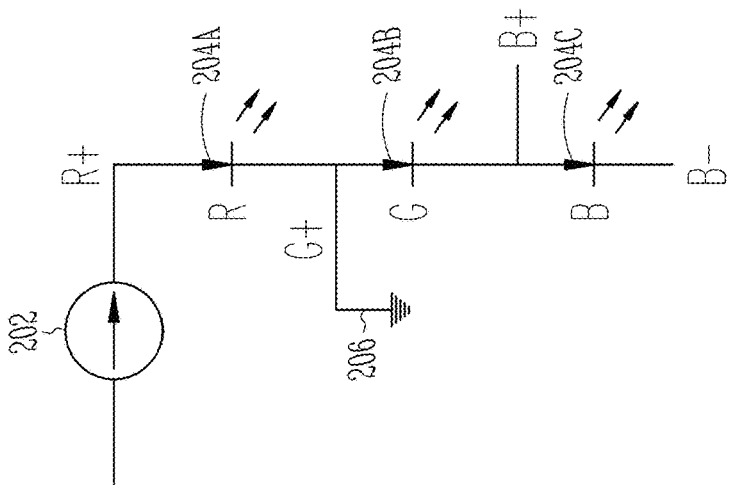

FIGS. 2A-2C show examples of sequential driving of the three-junction RGB polychromic device 100 shown in FIG. 1. During the first period 200a of a driving cycle, shown in FIG. 2A, current from a current source 202 traverses only the first junction 204a (not through the second junction 204b or third junction 204c).

The length of the driving cycle and individual period length may be selected as desired. Varying the driving cycle length affects how often a (RGB) cell (pixel) in a panel is updated; the update rate depends on factors such as the panel size and the refreshing rate. For example, if the panel has an array of 64×64 pixels, 4096 pixels may be updated to form an frame (image). In addition, the refresh rate may be set according to the expected content to display. The minimum refresh rate for the human eye to perceive motion is 30 frames per second (FPS). Therefore, the minimum driving cycle length may be dictated by 4096 pixels updated 30 times in a second (1 s/(4096*30)=8.13 μs). Higher refresh cycles (60 FPS, 120 FPS, 144 FPS) allow high dynamic content to smoothly appear on screen.

On the other hand, inside a driving cycle, the individual period over which a particular color is active may be adjusted to achieve a desired brightness level. A specific color is a mixture of different brightness levels of different colors (e.g., red, green, and blue), which may be a particular mixture of individual period lengths. Taking the example above in which each color is active over substantially identical time periods, each color may be active for one third of the driving cycle (8.13 μs/3=2.71 μs) to define how much of that time provides the desired color mix.

As above, although FIGS. 2A-2C shown the first junction 204a, the second junction 204b, and the third junction 204c as emitting R, G, B color light respectively, in other aspects the number of junctions and/or colors emitted by each junction may be different from that shown. As shown in FIG. 2A, during the first period 200a the current enters the R+ terminal and exits the G+ (R−) terminal to ground 206. Note that the terminals may be referred to as shown as R+, G+ (R−), B+ (G−), and B−, where, since current flows from the R+ terminal to the G+ terminal, the G+ terminal is synonymous with the R− terminal, and since current flows from the G+ terminal to the B+ terminal, the B+ terminal is synonymous with the G− terminal.

Similarly, during the second period 200b after the first period 200a, shown in FIG. 2B, current traverses only the second junction 204b. As shown in FIG. 2B, during the second period 200b the current enters the G+ terminal and exits the B+ (G−) terminal to ground 206. During the third period 200c after the second period 200b, shown in FIG. 2C, current traverses through only the third junction 204c. As shown in FIG. 2C, during the second period 200b the current enters the G+ terminal and exits the B+ (G−) terminal to ground 206. In this way, the circuit only has one current to control during a given period. Color tuning may be performed by individually adjusting each current for one driving cycle and/or by individually adjusting each on-time duration (for each junction 204a, 204b, 204c) within a single driving cycle.

FIG. 3 shows an example of a polychromic matrix. The polychromic matrix 300 may contain a large number (e.g., millions) of three-junction polychromic devices 302 that are addressed using individually-addressable bus lines 304, which in some aspects extend across the entirety of the polychromic matrix 300. Each cell 310 accordingly includes four terminals to implement the addressible bus lines 304. The polychromic matrix 300 in FIG. 3 may have a rectangular (as shown, square) shape. As above, in other aspects, the number of addressable bus lines 304 may be different with a different number of junctions.

To construct a display device, a polychromic device wafer or other type of substrate may be prepared via photolithographic techniques as described herein. As the cell 310 (also referred to as a pixel) has four terminals, and to operate the three junctions individually, horizontal ones of the addressible bus lines 304 shown in FIG. 3 are R+ and B+/G− and vertical ones of the addressible bus lines 304 are R−/G+ and B−. In various aspects, while the colors provided by the horizontal and the vertical ones of the addressible bus lines 304 are interchangeable, the pairing of R+ and B+/G− and pairing of R−/G+ and B− are fixed because of the vertically-stacked circuitry.

Figure 4:
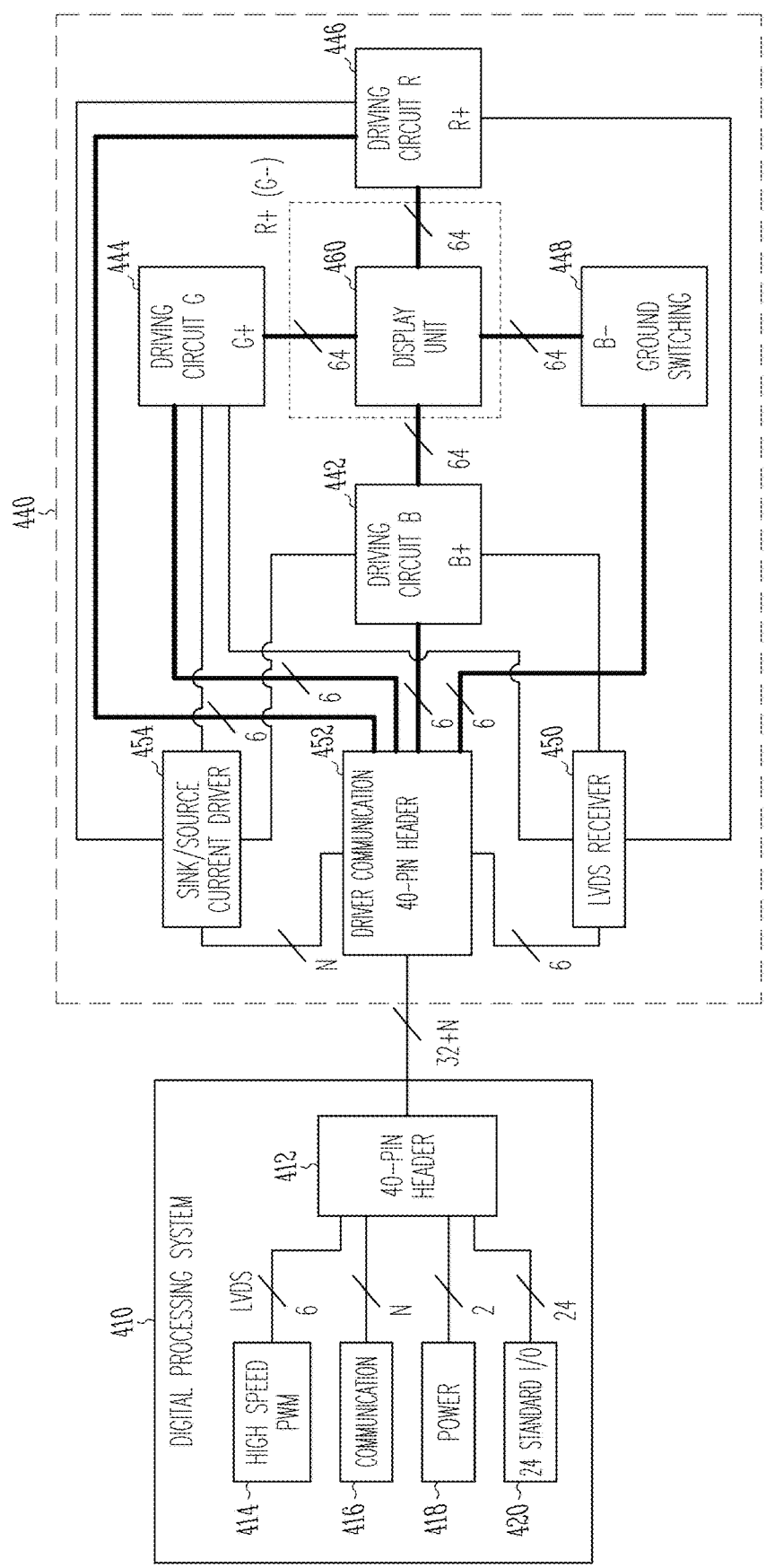
FIG. 4 shows an example of a block diagram of a lighting system.

FIG. 4 shows an example of a block diagram of a lighting system. The lighting system 400 is shown to contain multiple components to sequentially drive the junctions shown herein. The lighting system 400 includes a digital processing system (such as a Field-Programmable Gate Array (FPGA)) 410, driving circuitry 440, and display unit 460. The display unit 460 may include a microLED array as indicated herein. In some aspects, excluding the display unit 460, the components shown in FIG. 4 may form a controller. The digital processing system 410 may include a Field-Programmable Gate Array (FPGA).

The digital processing system 410 may be a controller to control the lighting system 400. The digital processing system 410 may include a number of components, including a header 412, a high speed pulse width modulator (PWM) circuit 414, a communication bus 416, a power supply 418 (voltage and ground), and a standard input/output (I/O) bus 420. The high speed PWM circuit 414 is high-speed communication module that in some aspects permits communications at speeds up to, for example, about 24 MHz or about 155 Mbps. Signals on the high speed PWM circuit 414 may use low-voltage differential signaling (LVDS) with multiple duty cycles (e.g., three, one for each junction to be driven). The communication bus 416 is a synchronous, multi-controller/multi-target, single-ended, serial communication bus used for lower-speed (about 0.1 Mbps to about 5 Mbps) communications. The communication bus 416 may carry, for example, two signals. The communication bus 420 may provide I/O signals for demultiplexing multiple bits, e.g., 4×6 bits for a 24 pin I/O bus. The digital processing system 410 may generate clock signals such as 23.6 MHz for a duty cycle of a PWM signal, 36.864 KHz for a pixel clock (the time a signal is applied to each pixel of the display unit 460), and 30 Hz for a frame clock (the time between frames of each image provided by the display unit 460).

In some aspects, the digital processing system 410 may be connected to the driving circuitry 440 through a header 412. The header 412 may be connected or otherwise electrically coupled to a header 452 of the driving circuitry 440 using a ribbon cable or other flexible connector. The cable may provide the signals of the digital processing system 410 to the driving circuitry 440. The driving circuitry 440 may also include a sink/source current driver 454, driving circuits 442, 444, 446, ground switching circuitry 448, and an LVDS receiver 450. As shown in FIG. 4, signals from the communication bus 416 of the digital processing system 410 may be supplied to a sink/source current driver 454 of the driving circuitry 440. The signals from the communication bus 416 may control the driving current provided by the sink/source current driver 454 of the driving circuitry 440.

The driving current from the sink/source current driver 454 may be supplied to each driving circuit 442, 444, 446 (B driving circuit 442, G driving circuit 444, R driving circuit 446) dependent on the signals from the digital processing system 410 provided through the header 452. The sink/source current driver 454 may provide a bias current for each color independent of the bias current used for any other color. Similarly, each driving circuit 442, 444, 446 may receive control signals from the digital processing system 410 provided through the header 452 to control selection of the bus lines being driven in the display unit 460. The ground switching circuitry 448 (B− bus line shown in FIG. 3) may likewise be controlled based on control signals from the digital processing system 410 provided through the header 452. The ground switching circuitry 448 may be used to achieve sequential driving by moving the circuit ground sync with an active junction during a particular period.

In operation, the digital processing system 410 may receive frames to display according to the panel size (e.g., 64×64) of the display unit 460 and produce digital signals that are provided to the driving circuitry 440. The driving circuitry 440 receives the signals and activates analog switches in each driving circuit 442, 444, 446 to sequentially decide which microLED (i.e., which pn junction in a microLED device) is to be activated, as well as the length of time for activation. The sink/source current driver 454 may provide current to each driving circuit 442, 444, 446; the digital processing system 410 may thus command a selected switch and turn on individual pixels of the display unit 460. Along with the switching information, the digital processing system 410 may establish the length of time each pixel is active by providing a duty cycle signal for each color. The duty cycle for each color may be individually set, or may be uniform for each color.

Figure 5:
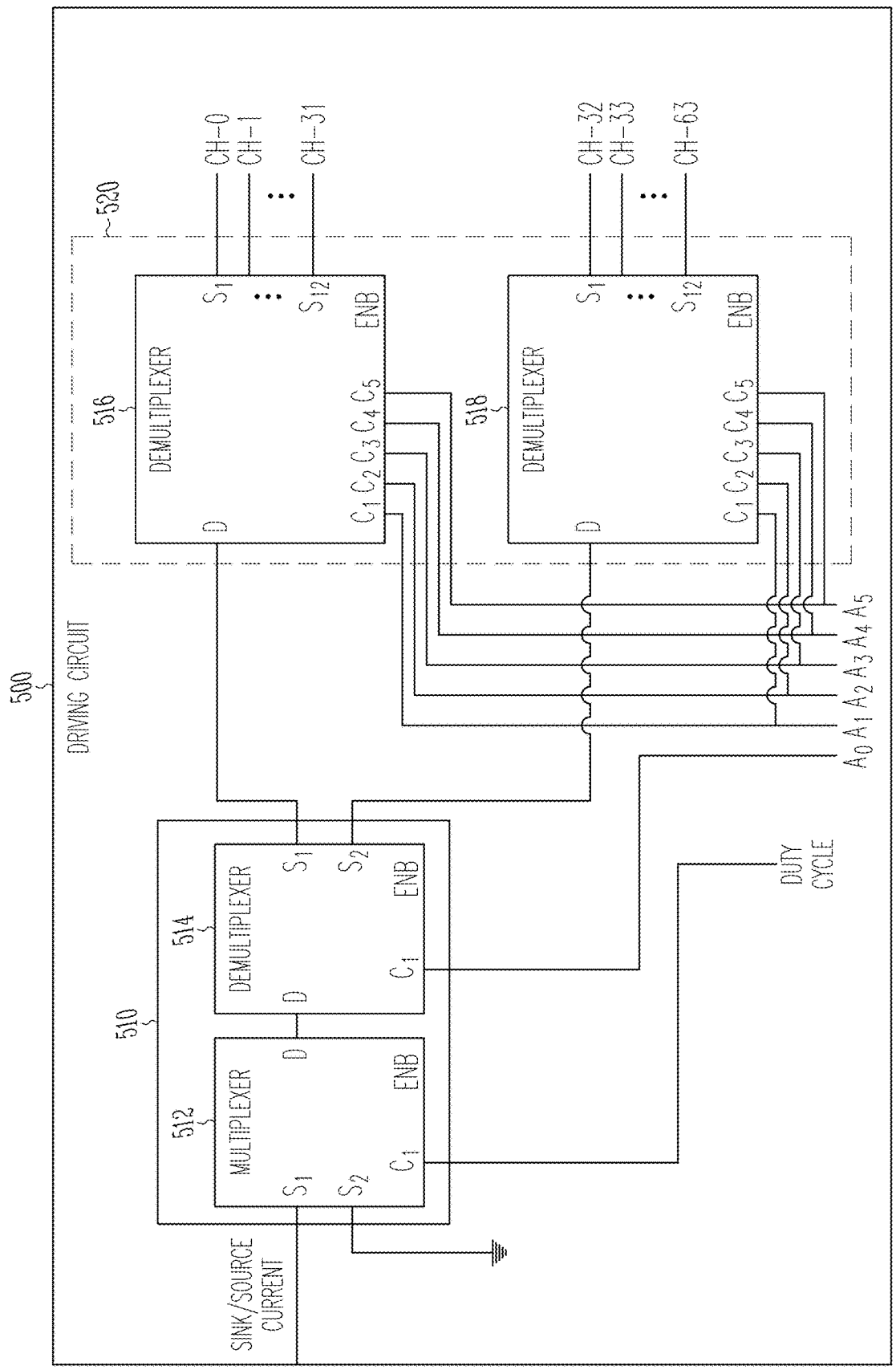
FIG. 5 shows an example of a driving circuit of the lighting system of FIG. 4.

FIG. 5 shows an example of a driving circuit of the system of FIG. 4. The driving circuit 500 may be one of the B driving circuit 442, G driving circuit 444, or R driving circuit 446 shown in FIG. 4. The driving circuit 500 includes a cascaded analog multiplexer 510 and an output stage 520 that includes one or more analog demultiplexers 516, 518. Analog circuits or switches may permit a constant and/or controllable current to be used, unlike their digital counterparts. The use of cascaded analog multiplexers 510 and analog demultiplexers 516, 518 enables the routing of a constant current through switches of the driving circuit 500 (rather than a constant voltage, which is normally routed by the switches) to enable the sequential driving of the microLEDs in each microLED device.

The cascaded analog multiplexer 510 may be a two channel analog multiplexer that receives sink/source current from the sink/source current driver 454 shown in FIG. 4 at one input, while the other input is grounded. The cascaded analog multiplexer 510 is activated based on the duty cycle of the particular period. This may effectively allow PWM dimming of the light from the individual microLEDs of each microLED device by not driving the microLED during the off duration. The cascaded analog multiplexer 510 may include a multiplexer 512 to which the duty cycle is supplied and a demultiplexer 514 to which a control signal is supplied to select a path to route the incoming duty cycle. The multiplexer 512 and demultiplexer 514 may be the same circuit coupled back-to-back in which the single data port (used as an output) of the multiplexer 512 is coupled to the single data port (used as an input) demultiplexer 514. The cascaded analog multiplexer 510 may accordingly act as a single pole double throw (SPDT) switch, which has a single input and can connect to and switch between two outputs (i.e., one input terminal and two output terminals). As shown, one of the inputs of the multiplexer 512 may be supplied with the sink/source current, while the other of the inputs of the multiplexer 512 may be grounded.

The cascaded analog multiplexer 510 may be used to select an input (i.e., either the sink/source current or ground as shown in FIG. 5), as well as to which of the demultiplexers 516, 518 of the output stage 520 to provide the input. The outputs from the demultiplexer 514 of the cascaded analog multiplexer 510 may be supplied to a data input of one of the demultiplexers 516, 518 of the output stage 520. The demultiplexers 516, 518 of the output stage 520 may be multi-channel demultiplexers, in which the control signals (control bits) from the digital processing system 410 are provided to control inputs of the demultiplexers 516, 518 of the output stage 520. The control bits are provided to the control inputs of the demultiplexers 516, 518 for the the demultiplexers 516, 518 to select a desired bus line of the display unit 460 to drive. In some aspects, the demultiplexers 516, 518 of the output stage 520 may each provide, for example, 32 outputs and thus sequentially address 64 channels in total to which to route the sink/source current. In this case, the driving circuit 500 may receive 7 control bits, 6 bits to select one of the 64 channels and a single bit to select between the sink/source current and ground.

Although the cascaded analog multiplexer 510 (and the multiplexer 512 and demultiplexer 514) is shown as a two-channel demultiplexer (selecting between two output channels), the cascaded analog multiplexer 510 may be an n-channel demultiplexer; or more than one multiplexer/demultiplexer pair may be used if a larger number of demultiplexers (channels) are used to connect to the cascaded analog multiplexer 510.

In operation, each driving circuit 500 may receive a unique constant current, which may be set according to the microLED color (and pixel) being driven. The current is provided to the multiplexer 512, which defines how long the current is to drive the selected microLED device and specific microLED within the microLED device, with the activation time being the duty cycle. The output stage 520 determines which of the channels is to carry the current to the display panel by cascading a tree of demultiplexers 516, 518. The control signals, as above, may include the duty cycle and multiplexer output address pins. The currents and/or duty cycles may be substantially identical (e.g., within variations due to mismatched electronics) or may be different.

Figure 6:
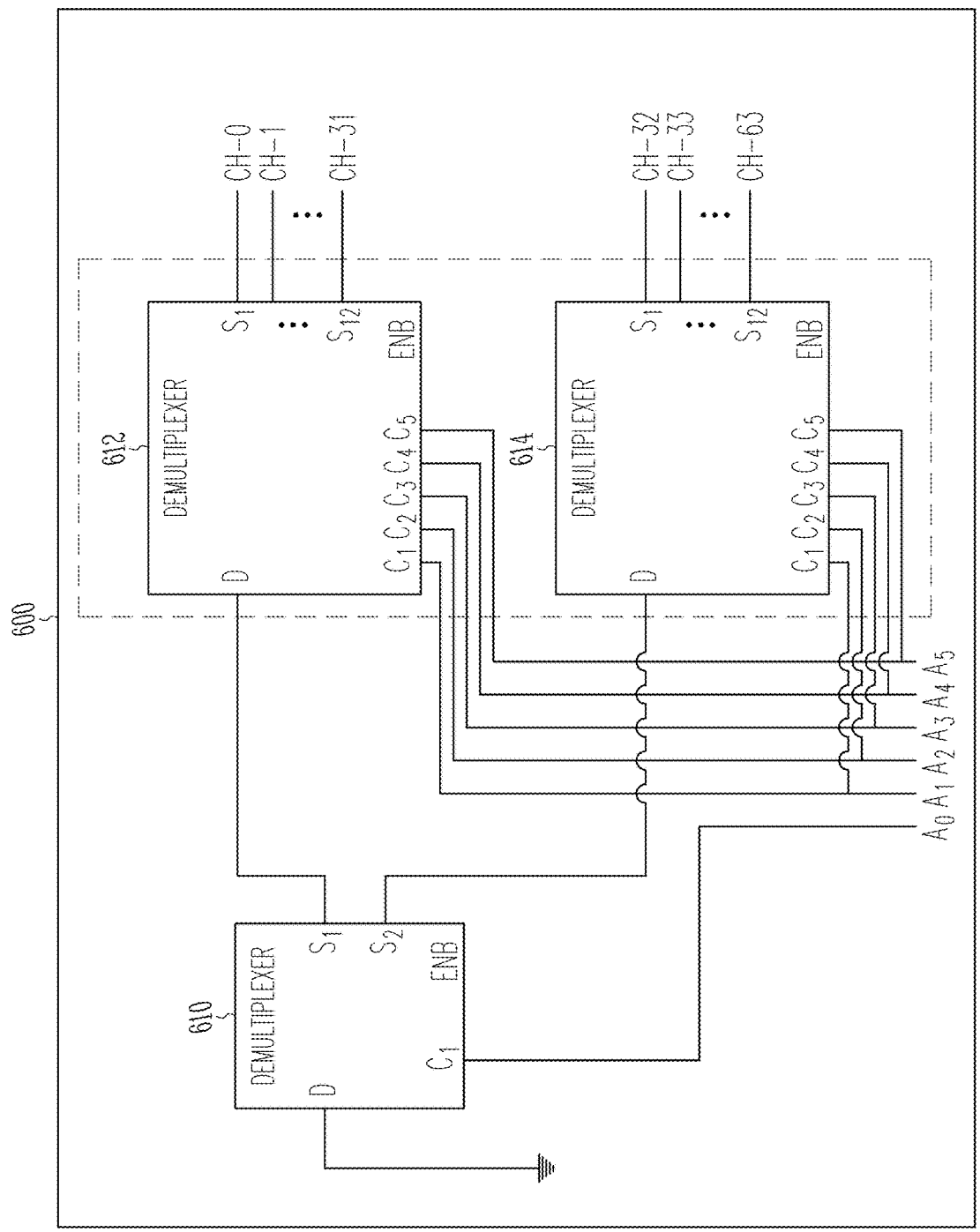
FIG. 6 shows an example of a ground switching circuit of the lighting system of FIG. 4.

FIG. 6 shows an example of a ground switching circuit of the system of FIG. 4. The ground switching circuit 600 may be similar to the driving circuit 500, including demultiplexers 610, 612, 614 but lacking the the multiplexer 512. The input of the first demultiplexer 610 is grounded and a single control signal is used to select one of the second demultiplexer 612 and third demultiplexer 614 to provide the ground to as an input. The second demultiplexer 612 and third demultiplexer 614 are coupled to control signals to select the desired bus line of the display unit to ground. In some aspects, the second demultiplexer 612 and third demultiplexer 614 may each provide, as above, 32 outputs and thus sequentially address 64 channels in total. Similar to the driving circuit 500, the ground switching circuit 600 may receive 6 control bits to select one of the 64 channels. Although the first demultiplexer 610 is shown as a two-channel demultiplexer (selecting between two output channels), the first demultiplexer 610 may be an n-channel demultiplexer; or more than one two-channel demultiplexers may be used if a larger number of channels are used.

Accordingly, in operation the ground switching circuit 600 decides, for example, when and where to switch (ground in this case) for the blue microLED to complete the individually-addressable pixel approach. As above, the ground switching circuit 600 does not receive a current source driver line, nor consequently the duty cycle signal.

Figure 7:
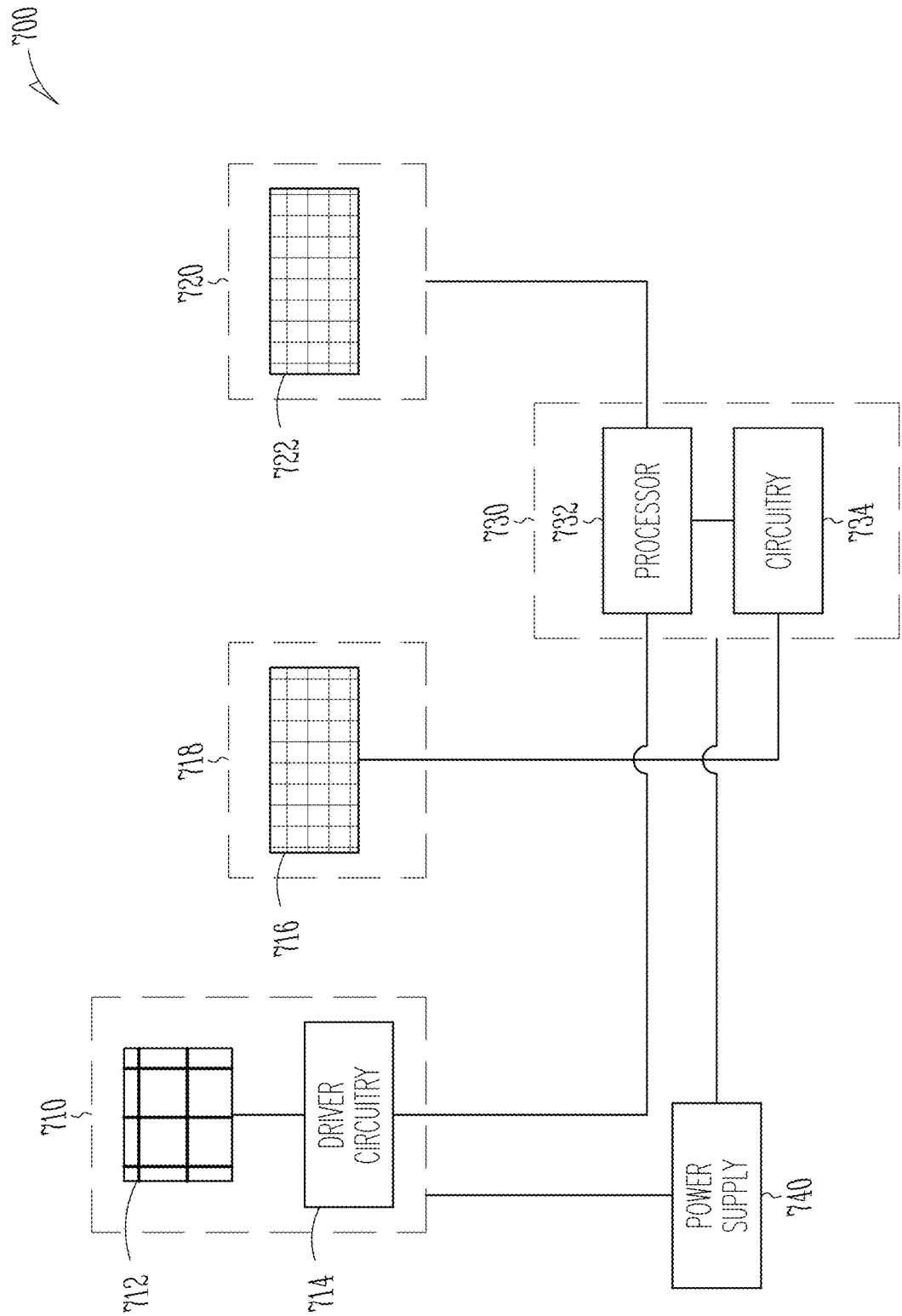
FIG. 7 shows an example lighting system.

FIG. 7 shows an example lighting system. The lighting system 700 may include one or more light sources 710. The light source 710 may include one or more microLED arrays 712, including a, as described herein. The light source 710 may include driving circuitry 714, as also described herein. A light detector 718 may contain a photodiode array 716 that detects the light from the microLED devices in the light source 710. The photodiode array 716 may be disposed within an apparatus containing the light source 710 or may be separate from the light source 710.

A controller 730 may include a processor 732 (e.g., a hardware-based processor, or equivalently, processing circuitry), which may be used to control various functions of the lighting system 700. As also shown, the controller 730 may contain further components, such as a circuitry 734 configured to drive, among others, the photodiode array 716 as controlled by the processor 732. In some embodiments, the circuitry 734 may also be configured to provide non-local driving of the microLED array 712 of the light source 710 and may include other circuits, e.g., the non-FPGA circuitry shown in FIG. 4 (including the driver circuitry if not present in the light source 710).

The light source 710 may include at least one lens and/or other optical elements such as reflectors. In different embodiments, a single lens may be disposed over the microLED array 712 or multiple lenses may be disposed over the microLED array 712. The lens and/or other optical elements may direct the light emitted by the microLED array 712 toward a target.

The processor 732 may also control one or more sensors 720 that includes a multi-pixel detector 722. The sensor 720 may sense light at the wavelength or wavelengths emitted by the microLED array 712 and reflected by a target, radiation that is emitted by the target, and or other wavelengths. The sensor 720 may, for example, be a radar or lidar sensor, or the processor 732 may be used to determine the presence of specific objects (e.g., other vehicles, people, road signs) nearby. The sensor 720 may include optical elements (e.g., at least one sensor lens) to capture the radiation. The multi-pixel detector 722 may include, for example, photodiodes or one or more other detectors capable of detecting light in the wavelength range(s) of interest. The multi-pixel detector 722 may include multiple different arrays to sense visible and/or infrared light. The multi-pixel detector 722 may have one or more segments (that are able to sense the same wavelength/range of wavelengths or different wavelength/range of wavelengths), similar to the photodiode array 716.

In some embodiments, instead of, or in addition to, being provided in the sensor 720, a multi-pixel detector may be provided in the light detector 718. In some embodiments, the light detector 718 and the sensor 720 may be integrated in a single module, while in other embodiments, the light detector 718 and the sensor 720 may be separate modules that are disposed on a printed circuit board (PCB) or other mount. In other embodiments, the light detector 718 and the sensor 720 may be attached to different PCBs or mounts. Similarly, the light source 710 may be integrated in a single module with the light detector 718 or may be separate from the light detector 718.

The microLEDs in the microLED array 712 may be driven as described herein. The components of the lighting system 700 shown in FIG. 7 may be provided power using a power supply 740, such as a battery.

Figure 8:
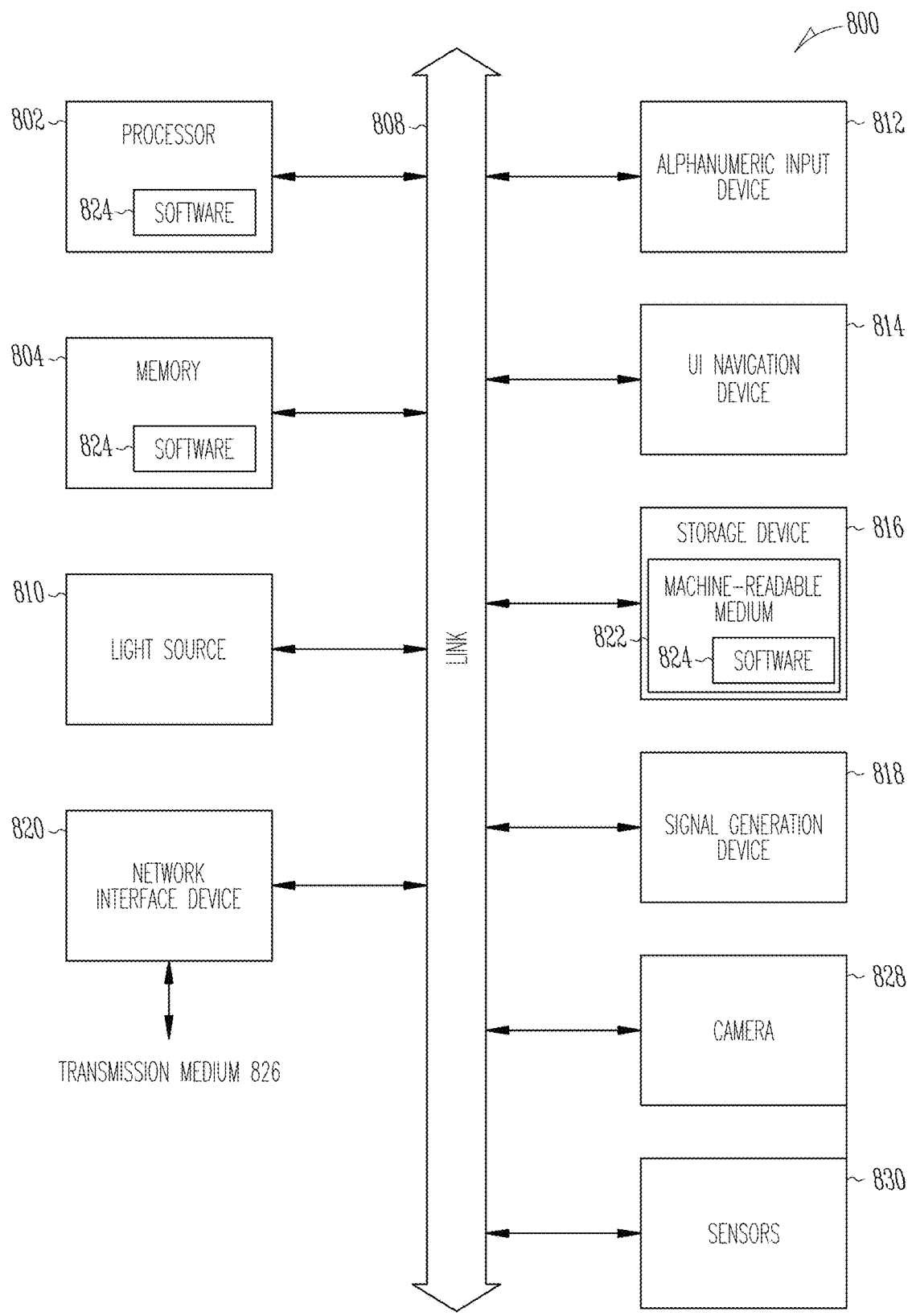
FIG. 8 shows an example of an electronic device in accordance with some embodiments of the disclosed subject-matter.

FIG. 8 illustrates an example of an electronic device 800 in accordance with some embodiments. The electronic device 800 may be, for example, a display, a monitor or screen, an AR/VR headset, a vehicular headlight, lighting for a particular area, or any other lighting arrangement. Various elements may be provided on a backplane indicated above, while other elements may be local or remote. Examples, as described herein, may include, or may operate on, logic or a number of components, modules, or mechanisms.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 800 may include a hardware processor (or equivalently processing circuitry) 802 (e.g., a central processing unit (CPU), a GPU, a hardware processor core, or any combination thereof), a memory 804 (which may include main and static memory), some or all of which may communicate with each other via an interlink (e.g., bus) 808. The memory 804 may contain any or all of removable storage and non-removable storage, volatile memory or non-volatile memory. The electronic device 800 may further include a light source 810 such as the microLEDs described above, or a video display, an alphanumeric input device 812 (e.g., a keyboard), and a user interface (UI) navigation device 814 (e.g., a mouse). In an example, the light source 810, input device 812 and UI navigation device 814 may be a touch screen display. The electronic device 800 may additionally include a storage device (e.g., drive unit) 816, a signal generation device 818 (e.g., a speaker), a network interface device 820, one or more cameras 828, and one or more sensors 830, such as a global positioning system (GPS) sensor, compass, accelerometer, or other sensor such as those described herein. The electronic device 800 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Some of the elements, such as one or more of the sparse arrays that provide the light source 810 may be remote from other elements and may be controlled by the hardware processor 802.

The storage device 816 may include a non-transitory machine readable medium 822 (hereinafter simply referred to as machine readable medium) on which is stored one or more sets of data structures or instructions 824 (e.g., software) embodying or utilized by any one or more of the techniques or functions described herein. The storage device 816 that includes the non-transitory machine readable medium should not be construed as that either the device or the machine-readable medium is itself incapable of having physical movement. The instructions 824 may also reside, completely or at least partially, within the memory 804 and/or within the hardware processor 802 during execution thereof by the electronic device 800. While the machine readable medium 822 is illustrated as a single medium, the term "machine readable medium" may include a single medium or multiple media (e.g., a centralized or distributed database, and/or associated caches and servers) configured to store the one or more instructions 824.

The term "machine readable medium" may include any medium that is capable of storing, encoding, or carrying instructions for execution by the electronic device 800 and that cause the electronic device 800 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 824 may further be transmitted or received over a communications network using a transmission medium 826 via the network interface device 820 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.14 family of standards known as WiMax, IEEE 802.14.4 family of standards, a Long Term Evolution (LTE) family of standards, a Universal Mobile Telecommunications System (UMTS) family of standards, peer-to-peer (P2P) networks, a next generation (NG)/6$^{th}$ generation (6G) standards among others. In an example, the network interface device 820 may include one or more physical jacks (e.g., Ethernet, coaxial, or phone jacks) or one or more antennas to connect to the transmission medium 826.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical CPU, a single- or multi-core processor, and/or any other device capable of executing or otherwise operating computer-executable instructions, such as program code, software modules, and/or functional processes.

The camera 828 may sense light at least the wavelength or wavelengths emitted by the microLEDs. The camera 828 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 802 may control and drive the LEDs via one or more drivers. For example, the processor 802 may optionally control one or more microLEDs in microLED arrays independent of another one or more microLEDs in the microLED arrays, so as to illuminate an area in a specified manner.

In addition, the sensors 830 may be incorporated in the camera 828 and/or the light source 810. The sensors 830 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 9:
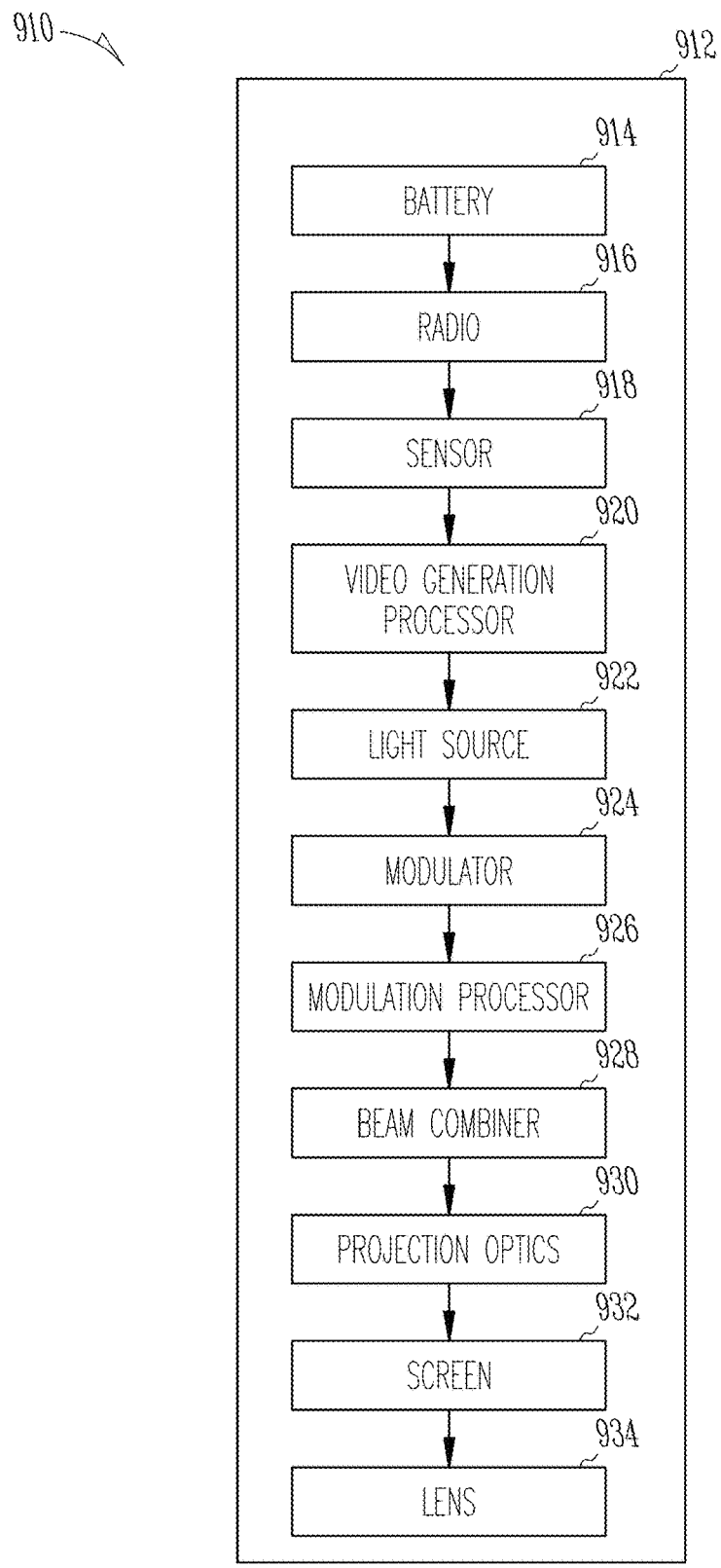
FIG. 9 shows a block diagram of an example of a visualization system that may include the light source described herein.

FIG. 9 shows a block diagram of an example of a visualization system that may include the light source described herein. The visualization system 910 can include a wearable housing 912, such as a headset or goggles. The housing 912 can mechanically support and house the elements detailed below. In some examples, one or more of the elements detailed below can be included in one or more additional housings that can be separate from the wearable housing 912 and couplable to the wearable housing 912 wirelessly and/or via a wired connection. For example, a separate housing can reduce the weight of wearable goggles, such as by including batteries, radios, and other elements. The housing 912 can include one or more batteries 914, which can electrically power any or all of the elements detailed below. The housing 912 can include circuitry that can electrically couple to an external power supply, such as a wall outlet, to recharge the batteries 914. The housing 912 can include one or more radios 916 to communicate wirelessly with a server or network via a suitable protocol, such as WiFi.

The visualization system 910 can include one or more sensors 918, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 918 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 918 can capture a real-time video image of the surroundings proximate a user.

The visualization system 910 can include one or more video generation processors 920. The one or more video generation processors 920 may receive scene data from a server and/or a storage medium. The scene data may represent a three-dimensional scene, such as a set of position coordinates for objects in the scene or a depth map of the scene. The one or more video generation processors 920 can receive one or more sensor signals from the one or more sensors 918. In response to the scene data, which represents the surroundings, and at least one sensor signal, which represents the location and/or orientation of the user with respect to the surroundings, the one or more video generation processors 920 can generate at least one video signal that corresponds to a view of the scene. In some examples, the one or more video generation processors 920 can generate two video signals, one for each eye of the user, that represent a view of the scene from a point of view of the left eye and the right eye of the user, respectively. In some examples, the one or more video generation processors 920 can generate more than two video signals and combine the video signals to provide one video signal for both eyes, two video signals for the two eyes, or other combinations.

The visualization system 910 can include one or more light sources 922 such as those described herein that can provide light for a display of the visualization system 910. Suitable versions of the one or more light sources 922 can include microLEDs as indicated above in addition to or instead of monolithic LEDs, one or more microLED arrays disposed on a common substrate, segmented microLEDs disposed on a single substrate whose microLEDs are individually addressable and controllable (and/or controllable in groups and/or subsets), and others. In some examples, one or more of the light sources 922 can include microLEDs disposed on a transparent flexible substrate, and a rigid substrate adhered to the transparent flexible substrate with an adhesive layer such that the microLEDs are located between the rigid substrate and the transparent flexible substrate.

The one or more light sources 922 can include light-producing elements having different colors or wavelengths. For example, a light source can include red microLEDs that can emit red light, green microLEDs that can emit green light, and blue microLEDs that can emit blue right. The red, green, and blue light combine in specified ratios to produce any suitable color that is visually perceptible in a visible portion of the electromagnetic spectrum.

The visualization system 910 can include one or more modulators 924. The modulators 924 can be implemented in one of at least two configurations.

In a first configuration, the modulators 924 can include circuitry that can modulate the light sources 922 directly. For example, the light sources 922 can include an array of light-emitting diodes, and the modulators 924 can directly modulate the electrical power, electrical voltage, and/or electrical current directed to each light-emitting diode in the array to form modulated light. The modulation can be performed in an analog manner and/or a digital manner. In some examples, the light sources 922 can include an array of red microLEDs, an array of green microLEDs, and an array of blue microLEDs, and the modulators 924 can directly modulate the red microLEDs, the green microLEDs, and the blue microLEDs to form the modulated light to produce a specified image.

In a second configuration, the modulators 924 can include a modulation panel, such as a liquid crystal panel. The light sources 922 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 924 can include multiple modulation panels that can modulate different colors of light. For example, the modulators 924 can include a red modulation panel that can attenuate red light from a red light source such as a red microLED, a green modulation panel that can attenuate green light from a green light source such as a green microLED, and a blue modulation panel that can attenuate blue light from a blue light source such as a blue microLED.

In some examples of the second configuration, the modulators 924 can receive uniform white light or nearly uniform white light from a white light source, such as a white-light microLED. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 910 can include one or more modulation processors 926, which can receive a video signal, such as from the one or more video generation processors 920, and, in response, can produce an electrical modulation signal. For configurations in which the modulators 924 directly modulate the light sources 922, the electrical modulation signal can drive the light sources 922. For configurations in which the modulators 924 include a modulation panel, the electrical modulation signal can drive the modulation panel.

The visualization system 910 can include one or more beam combiners 928 (also known as beam splitters 928), which can combine light beams of different colors to form a single multi-color beam. For configurations in which the light sources 922 can include multiple microLEDs of different colors, the visualization system 910 can include one or more wavelength-sensitive (e.g., dichroic) beam combiners 928 that can combine the light of different colors to form a single multi-color beam.

The visualization system 910 can direct the modulated light toward the eyes of the viewer in one of at least two configurations. In a first configuration, the visualization system 910 can function as a projector, and can include projection optics 930 that can project the modulated light onto one or more screens 932. Suitable versions of the projection optics 930 can include, for example, lenses, mirrors or other optical elements. The screens 932 can be located a suitable distance from an eye of the user. The visualization system 910 can optionally include one or more lenses 934 that can locate a virtual image of a screen 932 at a suitable distance from the eye, such as a close-focus distance, such as 500 mm, 750 mm, or another suitable distance. In some examples, the visualization system 910 can include a single screen 932, such that the modulated light can be directed toward both eyes of the user. In some examples, the visualization system 910 can include two screens 932, such that the modulated light from each screen 932 can be directed toward a respective eye of the user. In some examples, the visualization system 910 can include more than two screens 932. In a second configuration, the visualization system 910 can direct the modulated light directly into one or both eyes of a viewer. For example, the projection optics 930 can form an image on a retina of an eye of the user, or an image on each retina of the two eyes of the user.

For some configurations of AR systems, the visualization system 910 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

Figure 10:
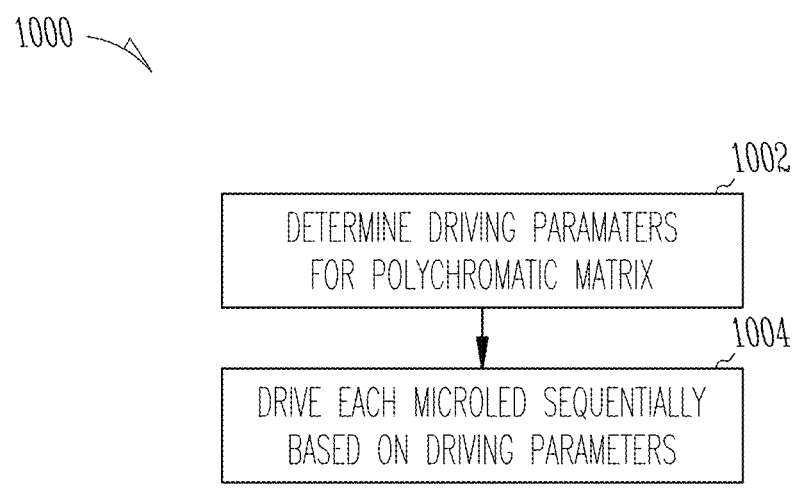
FIG. 10 show an example method of driving a polychromic matrix.

FIG. 10 show an example method of driving a polychromic matrix as disclosed in various embodiments herein. In some aspects, the process 1000 of FIG. 10 may be performed by a device or a portion thereof. At operation 1002, the process may include a processor determining driving parameters for a polychromic matrix. The processor may determine control signals to control driving circuitry to drive each microLED of a three (or more)—junction polychromic device in the matrix. The parameters may include current and driving time or duty cycle for each microLED individually. At operation 1004, the process may further include using the driving circuitry to sequentially drive each microLED in the array. The microLEDs in a particular microLED device of a pixel (or cell) may be sequentially driven using multiple bus lines provided to each pixel before moving to the next microLED device of another pixel. The pixels may be addressed sequentially or in any other manner as determined by the processing circuitry. Note that other operations may be present. Method operations can be performed substantially simultaneously or in a different order than that shown.

EXAMPLES

Example 1 is a light system comprising: an array of vertically-stacked multi-color micro light-emitting diode (microLED) devices, each microLED device configured to emit light of different colors; a plurality of drivers configured to independently drive each color of each microLED device; and processing circuitry configured to control the plurality of drivers, for each microLED device, to drive the microLED device to sequentially emit the colors.

In Example 2, the subject matter of Example 1 includes, wherein the processing circuitry is configured to control the plurality of drivers to avoid, for each microLED device, driving of the microLED device to simultaneously emit the colors.

In Example 3, the subject matter of any one of Examples 1-2 includes, wherein each microLED device includes: a first terminal coupled to a first end of a first pn junction, the first pn junction configured to emit first color light, a second terminal coupled to a first end of a second pn junction, the first end of the second pn junction coupled to a second end of the first pn junction, the second pn junction configured to emit second color light different from the first color light, a third terminal coupled to a first end of a third pn junction, the first end of the third pn junction coupled to a second end of the second pn junction, the third pn junction configured to emit third color light different from the first color light and the second color light, and a fourth terminal coupled to a second end of the third pn junction.

In Example 4, the subject matter of Example 3 includes, wherein the processing circuitry is configured to control the plurality of drivers to sequentially drive the first pn junction, the second pn junction, and third pn junction by: routing a first constant current to the first terminal via a first driver and grounding the second terminal during a first period of a cycle to limit driving during the first period to the first pn junction, routing a second constant current to the second terminal via a second driver and grounding the third terminal during a second period of the cycle to limit driving during the second period to the second pn junction, and routing a third constant current to the third terminal via a third driver and grounding the fourth terminal during a third period of the cycle to limit driving during the third period to the third pn junction.

In Example 5, the subject matter of Example 4 includes, wherein the first constant current, the second constant current, and the third constant current are independent of each other and are identical.

In Example 6, the subject matter of any one of Examples 4-5 includes, wherein the first constant current, the second constant current, and the third constant current are independent of each other and are different.

In Example 7, the subject matter of any one of Examples 4-6 includes, wherein an on-duration of the first constant current, the second constant current, and the third constant current in the cycle are independent of each other and are identical.

In Example 8, the subject matter of any one of Examples 4-7 includes, wherein an on-duration of the first constant current, the second constant current, and the third constant current in the cycle are independent of each other and are different.

In Example 9, the subject matter of any one of Examples 3-8 includes, wherein the array of microLED devices comprises an array of bus lines coupled to the plurality of drivers in which: a first bus line is coupled to the first terminal, a third bus line is coupled to the third terminal, and the first bus line is parallel to the third bus line, and a second bus line is coupled to the second terminal, a fourth bus line is coupled to the fourth terminal, and the second bus line is parallel to the fourth bus line.

In Example 10, the subject matter of any one of Examples 1-9 includes, wherein each driving circuit is configured to receive a bias current from a sink/source current driver and control signals from the processing circuitry.

In Example 11, the subject matter of any one of Examples 1-10 includes, wherein each driving circuit comprises an m-channel cascaded analog multiplexer and a plurality of n-channel analog demultiplexers, the m-channel cascaded analog multiplexer being configured to receive a sink/source current at a first input and ground at a second input and selectably provide the sink/source current or ground to one of the n-channel analog demultiplexers based on a control signal from the processing circuitry, the n-channel analog demultiplexers configured to select a channel to route the sink/source current or ground based on other control signals from the processing circuitry.

In Example 12, the subject matter of Example 11 includes, wherein: the m-channel cascaded analog multiplexer comprises a cascaded multiplexer and a cascaded demultiplexer, the cascaded demultiplexer is configured to receive the control signal from the processing circuitry and provide the one of the sink/source current and ground to the one of the n-channel analog demultiplexers, and the cascaded multiplexer is further configured to receive a pulse width modulated (PWM) signal from the processing circuitry to set a duty cycle over which the sink/source current is applied to the channel and dim illumination provided by microLEDs coupled to the channel.

In Example 13, the subject matter of any one of Examples 1-12 includes, a ground switching circuit configured to route ground to one of a plurality of terminals of each microLED, the ground switching circuit comprising an m-channel analog demultiplexer and a plurality of n-channel analog demultiplexers, the m-channel analog demultiplexer having a grounded input and selectably provide the ground to one of the n-channel analog demultiplexers based on a control signal from the processing circuitry, the n-channel analog demultiplexers configured to select a channel to route the ground based on other control signals from the processing circuitry.

In Example 14, the subject matter of any one of Examples 1-13 includes, wherein the microLED device is configured to emit red, green, and blue light.

Example 15 is a controller comprising: a plurality of drivers configured to independently drive a plurality of bus lines of an array of vertically-stacked multi-color micro light-emitting diode (microLED) devices, each microLED device having pn junctions configured to emit light of different colors, each microLED device having terminals each coupled to a different bus line to emit one of the different colors; a ground switching circuit configured to route ground to one of the bus lines; and processing circuitry configured to control the plurality of drivers and ground switching circuit to sequentially drive, for each microLED device, the colors of the microLED device by providing driving current to one of the bus lines and route the ground to another of the bus lines.

In Example 16, the subject matter of Example 15 includes, wherein the processing circuitry is configured to control the plurality of drivers and the ground switching circuit to driving each microLED device to avoid simultaneous emission of the colors.

In Example 17, the subject matter of either of Examples 15-16 includes, wherein the processing circuitry is configured to control constant currents routed to the bus lines to be independent of each other and identical.

In Example 18, the subject matter of any one of Examples 15-17 includes, wherein the processing circuitry is configured to control constant currents routed to the bus lines to be independent of each other and different.

In Example 19, the subject matter of any one of Examples 15-18 includes, wherein the processing circuitry is configured to control on-durations of constant currents routed to the bus lines to be independent of each other and identical.

In Example 20, the subject matter of any one of Examples 15-19 includes, wherein the processing circuitry is configured to control on-durations of constant currents routed to the bus lines to be independent of each other and different.

In Example 21, the subject matter of any one of Examples 15-20 includes, wherein the bus lines are arranged such that: a first bus line is coupled to first terminals of the microLEDs, a third bus line is coupled to third terminals of the microLEDs, and the first bus line is parallel to the third bus line, and a second bus line is coupled to second terminals of the microLEDs, a fourth bus line is coupled to fourth terminals of the microLEDs, and the second bus line is parallel to the fourth bus line.

In Example 22, the subject matter of any one of Examples 15-21 includes, wherein each driving circuit is configured to receive a bias current from a sink/source current driver and control signals from the processing circuitry.

In Example 23, the subject matter of any one of Examples 15-22 includes, wherein each driving circuit comprises an m-channel cascaded analog multiplexer and a plurality of n-channel analog demultiplexers, the m-channel cascaded analog multiplexer being configured to receive a sink/source current at a first input and ground at a second input and selectably provide the sink/source current or ground to one of the n-channel analog demultiplexers based on a control signal from the processing circuitry, the n-channel analog demultiplexers configured to select a channel to route the sink/source current or ground based on other control signals from the processing circuitry.

In Example 24, the subject matter of Example 23 includes, wherein; the m-channel cascaded analog multiplexer comprises a cascaded multiplexer and a cascaded demultiplexer, the cascaded demultiplexer is configured to receive the control signal from the processing circuitry and provide the one of the sink/source current and ground to the one of the n-channel analog demultiplexers, and the cascaded multiplexer is further configured to receive a pulse width modulated (PWM) signal from the processing circuitry to set a duty cycle over which the sink/source current is applied to the channel and dim illumination provided by microLEDs coupled to the channel.

In Example 25, the subject matter of any one of Examples 15-24 includes, wherein the ground switching circuit comprises an m-channel analog demultiplexer and a plurality of n-channel analog demultiplexers, the m-channel analog demultiplexer having a grounded input and selectably route the ground to one of the n-channel analog demultiplexers based on a control signal from the processing circuitry, the n-channel analog demultiplexers configured to select a channel to route the ground based on other control signals from the processing circuitry.

Example 26 is a method of providing light from an array of vertically-stacked multi-color micro light-emitting diode (microLED) devices each configured to emit light of different colors, the method comprising: independently driving each color of each microLED device; and controlling the driving of each microLED device to drive the microLED device to sequentially emit the colors.

In Example 27, the subject matter of Example 26 includes, driving each microLED device to avoid simultaneous emission of the colors.

In Example 28, the subject matter of Example 26 includes, wherein: each microLED device includes: a first terminal coupled to a first end of a first pn junction, the first pn junction configured to emit first color light, a second terminal coupled to a first end of a second pn junction, the first end of the second pn junction coupled to a second end of the first pn junction, the second pn junction configured to emit second color light different from the first color light, a third terminal coupled to a first end of a third pn junction, the first end of the third pn junction coupled to a second end of the second pn junction, the third pn junction configured to emit third color light different from the first color light and the second color light, and a fourth terminal coupled to a second end of the third pn junction, and controlling the driving of each microLED device comprises controlling driving to sequentially drive the first pn junction, the second pn junction, and third pn junction by: providing a first constant current to the first terminal via a first driver and grounding the second terminal during a first period of a cycle to limit driving during the first period to the first pn junction, providing a second constant current to the second terminal via a second driver and grounding the third terminal during a second period of the cycle to limit driving during the second period to the second pn junction, and providing a third constant current to the third terminal via a third driver and grounding the fourth terminal during a third period of the cycle to limit driving during the third period to the third pn junction.

In Example 29, the subject matter of Example 28 includes, wherein controlling the driving of each microLED device comprises controlling the first constant current, the second constant current, and the third constant current to be independent of each other and identical.

In Example 30, the subject matter of either of Examples 28-29 includes, wherein controlling the driving of each microLED device comprises controlling the first constant current, the second constant current, and the third constant current to be independent of each other and are different.

In Example 31, the subject matter of any one of Examples 28-30 includes, wherein controlling the driving of each microLED device comprises controlling an on-duration of the first constant current, the second constant current, and the third constant current in the cycle to be independent of each other and identical.

In Example 32, the subject matter of any one of Examples 28-31 includes, wherein controlling the driving of each microLED device comprises controlling an on-duration of the first constant current, the second constant current, and the third constant current in the cycle to be independent of each other and different.

In Example 33, the subject matter of any one of Examples 28-32 includes, wherein the array of microLED devices comprises an array of bus lines in which: a first bus line is coupled to the first terminal, a third bus line is coupled to the third terminal, and the first bus line is parallel to the third bus line, and a second bus line is coupled to the second terminal, a fourth bus line is coupled to the fourth terminal, and the second bus line is parallel to the fourth bus line.

In Example 34, the subject matter of Example 33 includes, wherein controlling the driving of each microLED device comprises receiving a bias current from a current driver and control signals from processing circuitry.

In Example 35, the subject matter of Example 33 includes, wherein the driving of each microLED device comprises using an m-channel cascaded analog multiplexer and a plurality of n-channel analog demultiplexers, the m-channel cascaded analog multiplexer receiving a sink/source current at a first input and ground at a second input and selectably providing the sink/source current or ground to one of the n-channel analog demultiplexers based on a control signal from processing circuitry, the n-channel analog demultiplexers selecting a channel to route the sink/source current or ground based on other control signals from the processing circuitry.

In Example 36, the subject matter of Example 35 includes, wherein the driving of each microLED device further comprises using the m-channel cascaded analog multiplexer to receive a pulse width modulated (PWM) signal from the processing circuitry to set a duty cycle over which the sink/source current is applied to the channel and dim illumination routed by microLEDs coupled to the channel.

In Example 37, the subject matter of Example 33 includes, wherein controlling the driving of each microLED device comprises grounding one of a plurality of terminals of each microLED using an m-channel analog demultiplexer and a plurality of n-channel analog demultiplexers, the m-channel demultiplexer having a grounded input and selectably providing ground to one of the n-channel analog demultiplexers based on a control signal from processing circuitry, the n-channel analog demultiplexers selecting a channel to route the ground based on other control signals from the processing circuitry.

Example 38 is a non-transitory computer-readable storage medium that stores instructions for execution by one or more processors of a light system, the one or more processors to configure the light system to, when the instructions are executed: independently drive each color of each micro light-emitting diode (microLED) device in an array of vertically-stacked multi-color microLED devices each configured to emit light of different colors; and control the driving of each microLED device to drive the microLED device to sequentially emit the colors.

In Example 39, the subject matter of Example 38 includes, wherein the one or more processors, when the instructions are executed, configure the light system to drive each microLED device to avoid simultaneous emission of the colors.

In Example 40, the subject matter of either of Examples 38-39 includes, wherein: each microLED device includes: a first terminal coupled to a first end of a first pn junction, the first pn junction configured to emit first color light, a second terminal coupled to a first end of a second pn junction, the first end of the second pn junction coupled to a second end of the first pn junction, the second pn junction configured to emit second color light different from the first color light, a third terminal coupled to a first end of a third pn junction, the first end of the third pn junction coupled to a second end of the second pn junction, the third pn junction configured to emit third color light different from the first color light and the second color light, and a fourth terminal coupled to a second end of the third pn junction, and wherein the one or more processors, when the instructions are executed, configure the light system to control the driving of each microLED device by controlling driving to sequentially drive the first pn junction, the second pn junction, and third pn junction by: providing a first constant current to the first terminal via a first driver and grounding the second terminal during a first period of a cycle to limit driving during the first period to the first pn junction, providing a second constant current to the second terminal via a second driver and grounding the third terminal during a second period of the cycle to limit driving during the second period to the second pn junction, and providing a third constant current to the third terminal via a third driver and grounding the fourth terminal during a third period of the cycle to limit driving during the third period to the third pn junction.

In Example 41, the subject matter of Example 40 includes, wherein the one or more processors, when the instructions are executed, configure the light system to control the driving of each microLED device by controlling the first constant current, the second constant current, and the third constant current to be independent of each other and identical.

In Example 42, the subject matter of either of Examples 40-41 includes, wherein the one or more processors, when the instructions are executed, configure the light system to control the driving of each microLED device by controlling the first constant current, the second constant current, and the third constant current to be independent of each other and are different.

In Example 43, the subject matter of any one of Examples 40-42 includes, wherein the one or more processors, when the instructions are executed, configure the light system to control the driving of each microLED device by controlling an on-duration of the first constant current, the second constant current, and the third constant current in the cycle to be independent of each other and identical.

In Example 44, the subject matter of any one of Examples 40-43 includes, wherein the one or more processors, when the instructions are executed, configure the light system to control the driving of each microLED device by controlling an on-duration of the first constant current, the second constant current, and the third constant current in the cycle to be independent of each other and different.

In Example 45, the subject matter of any one of Examples 40-44 includes, wherein the array of microLED devices comprises an array of bus lines in which: a first bus line is coupled to the first terminal, a third bus line is coupled to the third terminal, and the first bus line is parallel to the third bus line, and a second bus line is coupled to the second terminal, a fourth bus line is coupled to the fourth terminal, and the second bus line is parallel to the fourth bus line.

In Example 46, the subject matter of any one of Examples 38-45 includes, wherein the one or more processors, when the instructions are executed, configure the light system to control the driving of each microLED device by receiving a bias current from a current driver and control signals from processing circuitry.

In Example 47, the subject matter of any one of Examples 38-46 includes, wherein the one or more processors, when the instructions are executed, configure the light system to drive each microLED device using an m-channel cascaded analog multiplexer and a plurality of n-channel analog demultiplexers, the m-channel cascaded analog multiplexer receiving a sink/source current at a first input and ground at a second input and selectably providing the sink/source current or ground to one of the n-channel analog demultiplexers based on a control signal from processing circuitry, the n-channel analog demultiplexers selecting a channel to route the sink/source current or ground based on other control signals from the processing circuitry.

In Example 48, the subject matter of Example 47 includes, wherein the one or more processors, when the instructions are executed, configure the light system to drive each microLED device further using the m-channel cascaded analog multiplexer to receive a pulse width modulated (PWM) signal from the processing circuitry to set a duty cycle over which the sink/source current is applied to the channel and dim illumination routed by microLEDs coupled to the channel.

In Example 49, the subject matter of any one of Examples 38-48 includes, wherein the one or more processors, when the instructions are executed, configure the light system to control the driving of each microLED device by grounding one of a plurality of terminals of each microLED using an m-channel analog demultiplexer and a plurality of n-channel analog demultiplexers, the m-channel demultiplexer having a grounded input and selectably providing ground to one of the n-channel analog demultiplexers based on a control signal from processing circuitry, the n-channel analog demultiplexers selecting a channel to route the ground based on other control signals from the processing circuitry.

Example 50 is at least one machine-readable medium including instructions that, when executed by processing circuitry, cause the processing circuitry to perform operations to implement of any one of Examples 1-49.

Example 51 is an apparatus comprising means to implement of any of Examples 1-49.

Example 52 is a system to implement of any one of Examples 1-49.

Example 53 is a method to implement of any one of Examples 1-49.

In some embodiments, other components may be present, while in other embodiments not all of the components may be present. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations. Further, the term "includes" may be considered to be interpreted as "includes at least" the elements that follow.

While only certain features of the system and method have been illustrated and described herein, many modifications and changes will occur to those skilled in the art. It is, therefore, to be understood that the appended claims are intended to cover all such modifications and changes.

What is claimed is:

1. A light system comprising:
an array of polychromic micro light-emitting diode (microLED) devices, each microLED device having vertically-stacked pn junctions on a substrate in which each junction is configured to emit light of a different color than at least one other pn junction;
a plurality of drivers configured to independently drive each color of each microLED device; and
processing circuitry configured to control the plurality of drivers, for each microLED device, to drive the microLED device to sequentially emit the colors,
wherein each driver comprises an m-channel cascaded analog multiplexer and a plurality of n-channel analog demultiplexers, the m-channel cascaded analog multiplexer being configured to receive a sink/source current at a first input and ground at a second input and selectably provide one of the sink/source current and ground to one of the n-channel analog demultiplexers based on a control signal from the processing circuitry, the n-channel analog demultiplexers configured to select a channel to route the one of the sink/source current and ground based on other control signals from the processing circuitry.

2. The light system of claim 1, wherein the processing circuitry is configured to control the plurality of drivers to avoid, for each microLED device, driving of the microLED device to simultaneously emit the colors.

3. The light system of claim 1, wherein each microLED device includes:
a first terminal coupled to a first end of a first pn junction, the first pn junction configured to emit first color light,
a second terminal coupled to a first end of a second pn junction, the first end of the second pn junction coupled to a second end of the first pn junction, the second pn junction configured to emit second color light different from the first color light,
a third terminal coupled to a first end of a third pn junction, the first end of the third pn junction coupled to a second end of the second pn junction, the third pn junction configured to emit third color light different from the first color light and the second color light, and
a fourth terminal coupled to a second end of the third pn junction.

4. The light system of claim 3, wherein the processing circuitry is configured to control the plurality of drivers to sequentially drive the first pn junction, the second pn junction, and third pn junction by operations comprising:
routing a first constant current to the first terminal via a first driver and grounding the second terminal during a first period of a cycle to limit driving during the first period to the first pn junction,
routing a second constant current to the second terminal via a second driver and grounding the third terminal during a second period of the cycle to limit driving during the second period to the second pn junction, and
routing a third constant current to the third terminal via a third driver and grounding the fourth terminal during a third period of the cycle to limit driving during the third period to the third pn junction.

5. The light system of claim 4, wherein the first constant current, the second constant current, and the third constant current are independent of each other and are substantially identical.

6. The light system of claim 4, wherein the first constant current, the second constant current, and the third constant current are independent of each other and are different from each other.

7. The light system of claim 4, wherein an on-duration of the first constant current, the second constant current, and the third constant current in the cycle are independent of each other and are substantially identical.

8. The light system of claim 4, wherein an on-duration of the first constant current, the second constant current, and the third constant current in the cycle are independent of each other and are different from each other.

9. The light system of claim 3, wherein the array of microLED devices comprises an array of bus lines coupled to the plurality of drivers in which:
a first bus line is coupled to the first terminal, a third bus line is coupled to the third terminal, and the first bus line is parallel to the third bus line, and
a second bus line is coupled to the second terminal, a fourth bus line is coupled to the fourth terminal, and the second bus line is parallel to the fourth bus line.

10. The light system of claim 1, wherein each driving circuit is configured to receive a bias current from a current driver and control signals from the processing circuitry.

11. The light system of claim 1, wherein:
the m-channel cascaded analog multiplexer comprises a cascaded multiplexer and a cascaded demultiplexer,
the cascaded demultiplexer is configured to receive the control signal from the processing circuitry and provide the one of the sink/source current and ground to the one of the n-channel analog demultiplexers, and
the cascaded multiplexer is further configured to receive a pulse width modulated (PWM) signal from the processing circuitry to set a duty cycle over which the sink/source current is applied to the channel and dim illumination provided by pn junctions coupled to the channel.

12. The light system of claim 1, further comprising a ground switching circuit configured to route ground to one of a plurality of terminals of each pn junction, the ground switching circuit comprising an m-channel analog demultiplexer and a plurality of n-channel analog demultiplexers, the m-channel analog demultiplexer having a grounded input and selectably to provide the ground to one of the n-channel analog demultiplexers based on a control signal from the processing circuitry, the n-channel analog demultiplexers configured to select a channel to route the ground based on other control signals from the processing circuitry.

13. The light system of claim 1, wherein the microLED device is configured to emit red, green, and blue light.

14. A controller comprising:
a plurality of drivers configured to independently drive a plurality of bus lines of an array of polychromic micro light-emitting diode (microLED) devices, each microLED device having vertically-stacked pn junctions on a substrate in which each pn junction is configured to emit light of a different color than at least one other pn junction, each microLED device having terminals each coupled to a different bus line to emit one of the different colors;
a ground switching circuit configured to route ground to one of the bus lines; and
processing circuitry configured to control the plurality of drivers and ground switching circuit to sequentially drive, for each microLED device, the colors of the microLED device by providing a constant current to one of the bus lines and route the ground to another of the bus lines,
wherein each driver comprises an m-channel cascaded analog multiplexer and a plurality of n-channel analog demultiplexers, the m-channel cascaded analog multiplexer being configured to receive a sink/source current at a first input and ground at a second input and selectably provide one of the sink/source current and ground to one of the n-channel analog demultiplexers based on a control signal from the processing circuitry, the n-channel analog demultiplexers configured to select a channel to route the one of the sink/source current and ground based on other control signals from the processing circuitry.

15. The controller of claim 14, wherein the processing circuitry is configured to control the plurality of drivers and the ground switching circuit to driving each microLED device to avoid simultaneous emission of the colors.

16. The controller of claim 14, wherein the bus lines are arranged such that:
a first bus line is coupled to first terminals of the pn junctions, a third bus line is coupled to third terminals of the pn junctions, and the first bus line is parallel to the third bus line, and
a second bus line is coupled to second terminals of the pn junctions, a fourth bus line is coupled to fourth terminals of the pn junctions, and the second bus line is parallel to the fourth bus line.

17. The controller of claim 14, wherein:
the cascaded multiplexer is further configured to receive a pulse width modulated (PWM) signal from the processing circuitry to set a duty cycle over which the sink/source current is applied to the channel and dim illumination provided by pn junctions coupled to the channel.

18. The controller of claim 14, wherein the ground switching circuit comprises an m-channel analog demultiplexer and a plurality of n-channel analog demultiplexers, the m-channel analog demultiplexer having a grounded input and selectably route the ground to one of the n-channel analog demultiplexers based on a control signal from the processing circuitry, the n-channel analog demultiplexers configured to select a channel to route the ground based on other control signals from the processing circuitry.

19. A method of providing light from an array of polychromic micro light-emitting diode (microLED) devices, the method comprising:
independently driving each color of each microLED device in the array, each microLED device having vertically-stacked pn junctions on a substrate in which each junction is configured to emit light of a different color than at least one other pn junction; and
controlling the driving of each microLED device to drive the microLED device to sequentially emit the colors using drivers, wherein each driver comprises an m-channel cascaded analog multiplexer and a plurality of n-channel analog demultiplexers, the m-channel cascaded analog multiplexer being configured to receive a sink/source current at a first input and ground at a second input and selectably provide one of the sink/source current and ground to one of the n-channel analog demultiplexers based on a control signal, the n-channel analog demultiplexers configured to select a channel to route the one of the sink/source current and ground based on other control signals.

20. The method of claim 19, wherein:
the m-channel cascaded analog multiplexer comprises a cascaded multiplexer and a cascaded demultiplexer,
the cascaded demultiplexer is configured to receive the control signal from the processing circuitry and provide the one of the sink/source current and ground to the one of the n-channel analog demultiplexers, and
the cascaded multiplexer is further configured to receive a pulse width modulated (PWM) signal from the processing circuitry to set a duty cycle over which the sink/source current is applied to the channel and dim illumination provided by pn junctions coupled to the channel.

* * * * *